United States Patent [19]

Medlock et al.

[11] Patent Number: 5,608,676
[45] Date of Patent: Mar. 4, 1997

[54] CURRENT LIMITED CURRENT REFERENCE FOR NON-VOLATILE MEMORY SENSING

[75] Inventors: David L. Medlock, Austin; Eric J. Swanson, Buda, both of Tex.

[73] Assignee: Crystal Semiconductor Corporation, Austin, Tex.

[21] Appl. No.: 114,478

[22] Filed: Aug. 31, 1993

[51] Int. Cl.⁶ .................................................. G11C 7/00
[52] U.S. Cl. ...................................... 365/189.09; 365/210
[58] Field of Search ............................... 365/210, 189.09, 365/185, 207, 208; 307/296.1, 296.6, 296.5

[56] References Cited

U.S. PATENT DOCUMENTS

| | | | |
|---|---|---|---|
| 4,713,797 | 12/1987 | Morton et al. ........................ | 365/210 X |
| 5,045,772 | 9/1991 | Nishiwaki et al. ............. | 365/189.09 X |
| 5,148,063 | 9/1992 | Hotta .................................... | 365/210 X |
| 5,163,021 | 11/1992 | Mehrotra et al. .................. | 365/189.09 |

*Primary Examiner*—David C. Nelms
*Assistant Examiner*—Vu A. Le
*Attorney, Agent, or Firm*—Robert D. Lott

[57] ABSTRACT

A non-volatile memo includes the reference cells programmed to opposite logic states whose outputs are combined and then equally divided to provide a reference signal to a sense amplifier which is one half of the sum of the signals from a high conductivity data cell and a low conductivity data cell. The non-volatile memory also includes a bias voltage generator which uses a high conductivity non-volatile reference cell for a reference, and which produces a bias voltage which is coupled to current limiting transistors at the inputs of the sense amplifier so that the current into the sense amplifier is limited and therefore limits the power used by the non-volatile memory.

5 Claims, 4 Drawing Sheets

16, 18, 20, 22 & 52

CURRENT LIMITED CURRENT REFERENCE FOR NON-VOLATILE MEMORY SENSING

TECHNICAL FIELD

This invention relates to non-volatile memory circuits and in particular to the reference portion of sensing circuits used in such memories.

BACKGROUND OF THE INVENTION

A variety of sensing techniques have been employed for retrieving data from non-volatile memory arrays. Generally, these consist of a means of connecting a plurality of memory cells to a data input of a sense amplifier or comparator circuit and a reference quantity (either a reference potential or a reference current) to a reference input of the same comparator circuit. This comparator determines the binary state of the connected memory cell.

A benchmark of the state of the art in this field is defined by the quality of the reference quantity provided to the comparator circuit. A differential memory cell which consists of two single non-volatile memory cells programmed to opposite binary states would be ideal in that the reference and data quantities both would be provided by the memory cell. Well understood differential sensing techniques could be applied readily to such a differential memory cell. However, this arrangement requires two memory devices to store one bit of data.

In practice, a single ended memory cell is used in favor of the differential cell. A plurality of single ended cells is connected to the data input of a comparator circuit and a single reference quantity is provided as the comparator's reference input. Although less robust than the differential memory cell, the single ended memory cell is approximately half the size of the differential memory cell. Work in this area has focused on generating a suitable reference quantity and appropriate sensing circuitry which can utilize the reference to determine the binary state of the memory cells.

In non-volatile memories, the data storage element is the floating gate of an MOS transistor. The charge on this floating gate is altered by one of three methods: charge can be removed by exposing the data storage elements to ultra-violet light, charge can be added by generating hot electrons in the immediate vicinity of the data storage element, and charge can be either added or removed by tunnelling electrons across a thin oxide. The end result is a shift in the threshold voltage of the MOS transistor and, under proper biasing, a difference in conductivity can be created. In a non-volatile memory application, a high conductivity state and a low conductivity state are created using one of the three methods of altering charge on the floating gate.

In U.S. Pat. No. 4,301,518 a single dummy EPROM cell is connected in series to a resistive load device (an MOS transistor in the specific embodiment). This resistive divider provides a reference voltage to a differential sense amplifier. Data cells are connected in an identical series fashion to a similar load device which has one half of the resistance of the reference load device (mentioned in column 4, line 25 of the text). In effect, the dummy cell current and data cell current flow in two differently valued resistive loads, thus creating a differential voltage which can be sensed. In this invention, the load devices must be carefully crafted to match the characteristics of EPROM cells so as to provide inputs to the sense amplifier which do not exceed the input range of the sense amplifier.

In U.S. Patent No. 4,713,797 a current reference is provided to the reference input of a current comparator. This current is provided by a dummy cell programmed to a high conductivity state. The data input to the current comparator comes from a memory cell connected in the same fashion as the dummy reference cell. However, through current mirroring and MOS device scaling, which are well understood in the art, the data current is doubled. In effect, the reference current is compared to two times the data current. Although functional, this method suffers from the disadvantage that the low conductivity state of a memory cell must provide less than half of the current of a high conductivity cell (the reference) or the circuit will not sense the proper state of the memory. While this condition is virtually certain in a properly designed non-volatile memory, the data retention time of the memory system will be limited by this deficiency.

U.S. Pat. Nos. 4,301,518 and 4,713,797, mentioned above, use a dummy cell whose conductivity is substantially the same as one of the binary states of the data memory cells. Circuit techniques are used in the comparator logic to sense the state of the memory cells. In other patents, a different approach was taken. In one such alternative approach the dummy cell itself is altered to provide a current reference which is between the erased and written values of the programmed data memory cells.

For example, in U.S. Pat. No. 4,434,479 the reference memory cell is substantially identical to the data memory cells. However, the programming logic for the reference cells permits programming them to an intermediate value. In effect, the conductivity of the reference memory cell is between that of an erased transistor and a written transistor.

In U.S. Pat. No. 5,081,610 the reference memory cell has an extra diode connected to what would have been a floating gate. This diode discharges the floating gate and has the same effect as programming it to an intermediate value, as mentioned in U.S. Pat. No. 4,434,479 above.

In U.S. Pat. No. 4,972,378 the reference memory cell is a single non-volatile transistor which has a physical structure differing from that of the data memory cells. This difference is such that the conductivity of the reference cell will be between that of the erased and written data memory cells.

In U.S. Pat. No. 5,172,338 a multi-state EEPROM uses reference cells whose threshold voltages and thus their conductivity are controlled by external circuitry. Multiple voltage thresholds are used to sense more than two binary states in a programmed data cell. In this implementation, a memory cell can store four distinct states.

SUMMARY OF THE INVENTION

An object of this invention is to provide a reference cell which matches the process and environmentally dependent electrical characteristics of the memory cells.

Another object of this invention is to provide a reference cell which matches the long term charge retention and drift characteristics of the memory cells; thus extending the operating life of the memory system and/or increasing the number of erase/write cycles the memory can endure.

Yet another object of this invention is to provide a current reference which can be current limited in order to reduce the power consumption of the memory system.

Shown in an illustrated embodiment of the invention is a non-volatile memory which includes a plurality of non-volatile semiconductor memory cells together with a sense amplifier having a data input coupled to the memory cells.

The non-volatile memory also includes first and second reference cells; in opposite logic states and each having an output coupled together into a reference input of the sense amplifier.

Also shown in an illustrated embodiment of the invention is a non-volatile memory comprising a plurality of non-volatile memory semiconductor memory cells coupled through a selection tree and a current limiting transistor to a sense amplifier. The non-volatile memory also includes a current reference circuit comprising the series combination of a current source, a first transistor, a plurality of transistors, and a non-volatile semiconductor memory cell programmed to be conductive. The plurality of transistors forms a series of a plurality of transistors wherein the number of transistors corresponds to the number of transistors in the selection tree which are conductive during a memory cycle. The gate of the first transistor is coupled to the junction of the current source and the first transistor and is also coupled to the gate of the current limiting transistor.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
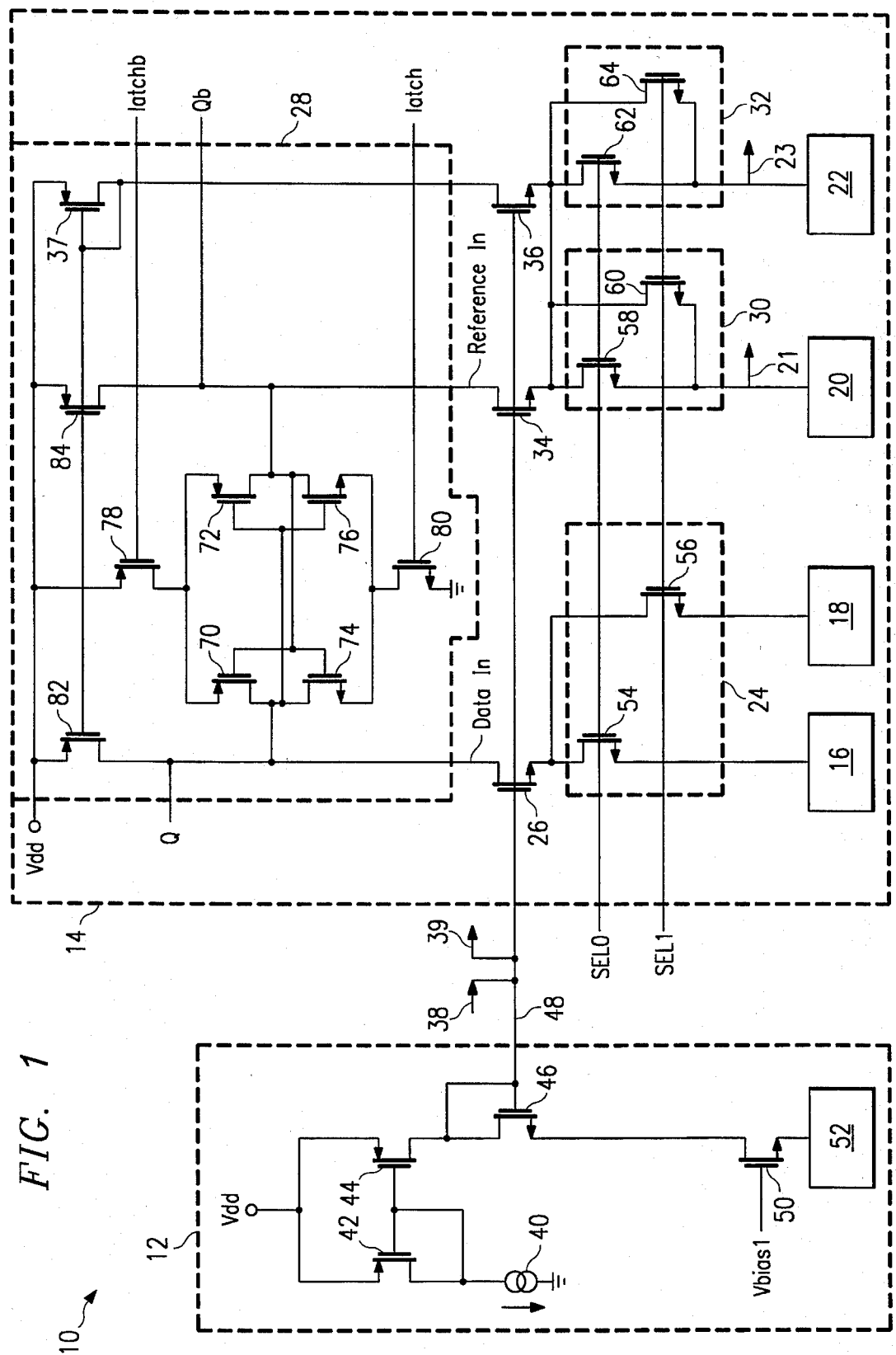
FIG. 1 is a circuit diagram of a non-volatile memory according to the present invention.

It will be appreciated that for purposes of clarity and where deemed appropriate, reference numerals have been repeated in the figures to indicate corresponding features.

DETAILED DESCRIPTION OF THE PREFERRED EMBODIMENT

A non-volatile memory, according to the preferred embodiment of the present invention, includes a bias voltage generator which supplies a reference voltage which is used to limit the input current to a sense amplifier from a non-volatile semiconductor data cell and from a non-volatile semiconductor reference cell. The current is advantageously limited to limit the power drawn by each of the sense amplifiers.

A non-volatile memory, according to the preferred embodiment of the present invention, also includes two non-volatile semiconductor memory reference cells which are identical to the data memory cells. The first of the two reference cells is programmed to an erase state or conductive state, and the second of the two reference cells is programmed to a written state, or a non-conductive state. During a normal sensing operation, a data cell is coupled to the data input of the current sense amplifier through a selection tree and current limiting transistor to the data input of the sense amplifier. Each of the reference cells is coupled through an array of transistors which provide virtually the same characteristics as the selection tree. The outputs from the array of transistors for each reference cell are coupled together and then coupled through two current limiting transistors in parallel, one of which goes to the reference input of the sense amplifier.

The use of two reference cells is ideal from a sensing point of view in that the reference quantity is exactly halfway between the one state (erase or conductive state) and the zero state (written or non-conductive state) of the data quantity. The reference memory cells are constructed virtually identically to the data memory cells and programmed with the same programming logic. Therefore, the reference input to the sense amplifier will track environmental conditions, processing variations, and long term charge decay characteristics of the data cells.

Using current sensing eliminates the deficiencies in U.S. Pat. No. 4,301,518 which uses voltage sensing and is sensitive to process variations in dissimilar elements (e.g., resistive load vs. EPROM cell).

Using a reference which is the sum of currents in a written and an erased non-volatile transistor eliminates the deficiency in the Morton and Engles patent which will not function if the low conductive current is more than one half of the high conductive current. With current technology, this would not affect initial operation but will affect the long term data retention of the non-volatile memory system.

Using a reference cell which is constructed from non-volatile transistors which are identical to the data cells and are programmed with the same programming logic eliminates the deficiencies in U.S. Pat. Nos. 4,434,479 and 5,081,610. U.S. Pat. No. 4,434,479 suffers from the fact that the intermediate value to which the reference is programmed would be difficult to quantify and the long term charge decay properties will not match that of the data memory cells. U.S. Pat. No. 5,081,610 adds an additional component to the reference memory cell which is not in the data memory cells and thus alters the matching characteristics.

Turning now to the drawings, FIG. 1 shows a non-volatile memory 10 which includes a bias voltage generator 12 and a memory sensing circuit 14. The memory sensing circuit 14 includes first and second non-volatile semiconductor data cells 16 and 18 and two non-volatile semiconductor memory reference cells 20 and 22. The sensing circuit 14 also includes a selection tree 24 coupled between the output of the data cells 16 and 18 and a current limiting transistor 26 which in turn is coupled to the data input of a sense amplifier, which in the preferred embodiment is a current comparator 28. The memory sensing circuit 14 also includes a first and second set of series transistors 30 and 32 which provide the same signal path the output data cells would take when passing through the selection tree 24. The output of the set of transistors 30 and 32 are connected together and into two limiting transistors 34 and 36. The output of the transistor 34 is connected to the reference input of the current comparator 28 and the output of the transistor 36 is connected to a current generator transistor 37 inside of the current comparator 28.

The bias voltage generator 12 includes a current reference 40 which is connected to a current mirror consisting of two p-channel transistors 42 and 44. The source of the transistor 44 is connected to Vdd and the drain is connected to the drain of an n-channel transistor 46. The gate of the n-channel transistor 46 is also connected to the drain of the transistor and the gate forms the output on line 48 of the bias voltage generator 12. The source of the transistor 46 is connected to the drain of an n-channel transistor 50, the gate of which is connected to a bias voltage Vbias1 and the source of which is connected to the input of a non-volatile semiconductor memory cell 52.

The bias generator 12 provides an output voltage on line 48 (also node 48) which is derived from the current flowing through transistor 46. The current through transistor 46 is no greater than the current generated by the current source 40 and mirrored by transistors 42 and 44.

The sensing circuit 14 receives the output of the bias voltage generator on line 48 which is coupled to the gates of the transistors 26, 34, and 36. The drain of transistors 26, 34, and 36 are connected to the current comparator sense amplifier 28. The source of transistor 26 is connected to the output of the selection tree 24 which in the preferred embodiment comprises an n-channel transistor 54 whose gate is connected to a selection signal SEL0 and whose source is connected to the output of the data memory cell 16. A second transistor 56 has its drain connected to the source of transistor 26 and its gate connected to a selection signal SEL1. The source of transistor 56 is connected to the data memory cell 18. The source of the transistor 34 is connected to the set of transistors 30 which comprises a first n-channel transistor 58 and a second n-channel transistor 60. The drains of the two transistors 58 and 60 are connected together and to the source of the transistor 34. The gate of transistor 58 is connected to the SEL0 signal and the gate of transistor 60 is connected to the SEL1 signal. The sources of transistors 58 and 60 are connected together and to the reference cell 20.

Similarly, the source of transistor 36 is connected to the set of transistors 32 which consists of two n-channel transistors 62 and 64. The drains of the transistors 62 and 64 are connected together and to the source of transistor 36 and also to the source of transistor 34. The sources of the transistors 62 and 64 are connected together and to the reference memory cell 22. The gate of transistor 62 is driven by SEL0 and the gate of transistor 64 is driven by SEL1.

The current comparator sense amplifier 28 consists of two cross coupled p-channel transistors 70 and 72 and two cross coupled n-channel transistors 74 and 76. The sources of the p-channel transistors 70 and 72 are connected together and to the drain of another p-channel transistor 78, the source of which is connected to Vdd. The gate of transistor 78 is driven by a signal latchb. Similarly, the sources of the n-channel transistor 74 and 76 are connected together and to the drain of another n-channel transistor 80, the source of which is connected to ground and the gate of which is connected to a timing signal latch. The drains of transistor 70 and 74 are connected together and also to the drain of transistor 26 and form the output signal Q. The drains of transistor 70 and 74 are also connected to the gates of transistors 72 and 76. Similarly, the drains of transistors 72 and 76 are connected together and to the drain of transistor 34 and form the output signal Qb. The drains of the transistors 72 and 76 are also connected to the gates of transistors 70 and 74 to form cross coupled pairs. Three current biasing transistors 82, 84, and 37 have their gates connected together and their sources connected to Vdd. The drain of transistor 82 is connected to the drain of transistor 26, the drain of transistor 84 is connected to the drain of transistor 34, and the drain of transistor 37 is connected to the drain of transistor 36 and also to the gate of transistor 37.

In operation, the non-volatile memory cell 52 is programmed to be conductive to thereby generate a voltage on line 48 which enables transistors 26, 34, and 36, which operate as current limiting transistors, to be conductive up to a certain amount of current which, in the preferred embodiment, is 20 μa per transistor. If the transistors 26, 34, and 36 were not present, or if the gates of these three transistors were connected to Vdd rather than node 48, and if the memory cells 16, 18, 20, and 22 would draw a large amount of current, then there would be no current limiting in the sense amplifier circuit 14 and the memory would draw a large amount of current. The transistors 26, 34, and 36, in conjunction with the bias generator 12, limits the current drawn by the memory even if some of the memory cells would draw a large amount of current if they weren't current limited.

A read operation starts with the latch signal low and the latchb signal high. One of the data memory cells 16 or 18 is selected by bringing either SEL0 or SEL1 high to enable transistors 54 or 56, respectively. The signal from the data memory cell is then passed through transistor 26 and onto the gate of the transistors 72 and 76. Since at this time the transistors 78 and 80 are not conductive, the transistors 70, 72, 74, and 76 do not affect the voltage generated at the drain of transistor 26. Similarly, when the SEL0 or the SEL1 line goes high, then either transistors 58 and 62 or transistors 60 and 64 respectively are made conductive which causes the current from the two reference memory cells 20 and 22 to be added together at the drain junction of transistors 58, 60, 62, and 64 and then split between transistors 34 and 36. The bias generated on the drain of transistor 34 is coupled to the gate of transistors 70 and 74.

Since the drains of transistors 58, 60, 62, and 64 are shorted together, the current in reference cell 20 will be added to the current in reference cell 22. This current will be split through transistors 34 and 36. Since one of the reference cells is conductive and the other reference cell is programmed to be non-conductive, the current through each of the transistors 34 and 36 will be approximately one half the current of a conductive cell and therefore provide the midpoint reference to the current comparator sense amplifier 28. This reference is ideal from a sensing point of view in that the reference quantity is exactly halfway between the 1 state and the 0 state of the data quantity. Since the reference memory cells are identical to the data memory cells, this reference quantity will track environmental conditions, process variations, and the long term charge decay characteristics of the memory cells.

After the currents and voltages have stabilized, the latch signal is brought high and the latchb signal is brought low which causes the cross coupled transistors 70, 72, 74, and 76 to reach a latch state to provide logic 0 and logic 1 signals on the Q and Qb outputs depending on the data stored in the data memory cell 16 or 18.

It is advantageous that the transistors 26, 34, 36, and 46 be matched to each other and that the transistors in the selection tree 24 be matched to the transistors in the transistor group 30 and 32 and also to the transistor 50 in the bias voltage generator circuit 12. Also it is advantageous that the non-volatile memory cells 16, 18, 20, 22, and 52 are of the same type. This cell is used in the preferred embodiment as shown in FIG. 3, but virtually any kind of non-volatile semiconductor memory cell may be used for the data cell 16, 18, 20, 22, and 52.

Figure 2:
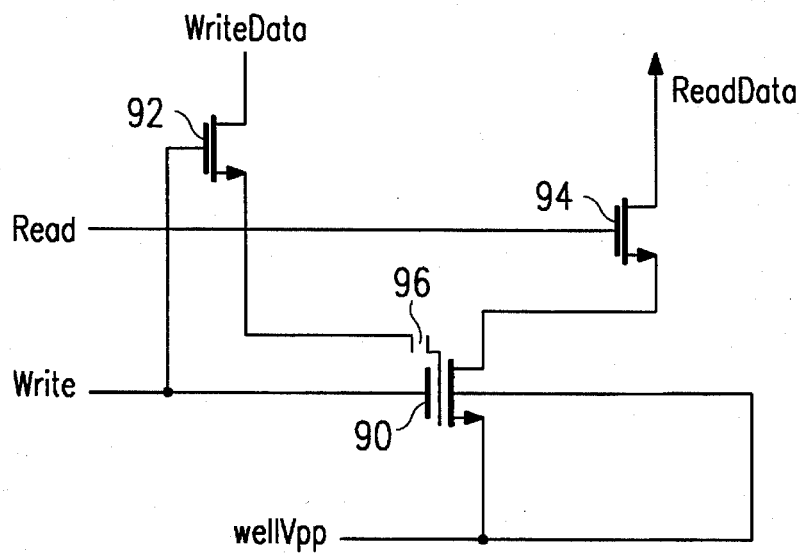
FIG. 2 is a schematic diagram of a non-volatile semiconductor memory cell used in the preferred embodiment of the present invention.

FIG. 2 is a schematic diagram of the embodiment of the memory cells 16, 18, 20, 22, and 52. The non-volatile cell shown in FIG. 2 is of conventional design and consists of a floating gate n-channel transistor 90 having its control gate coupled to a write signal and also coupled to the gate of an n-channel transistor 92, the drain of which is connected to write circuitry not shown in the drawings. The source of transistor 92 is coupled by capacitor 96 to the floating gate of the floating gate transistor 90. The drain of transistor 90 is connected to the source of another n-channel transistor 94, the drain of which provides the output signal to the transistors 54, 56, 58, 60, 62, 64, and 50. The gate of the transistor 94 is connected to the read signal which is driven by circuitry not shown in the drawings. The source and the well of the floating gate transistor 90 are connected to the well of the programming voltage shown as well Vpp which, during normal read operations, is at ground potential.

During a sensing operation, the read signal is brought high for each of the data cells 16 and 18 in one of the 23 rows to thereby provide data to 32 sense amplifiers 14. The read lines on the reference data cells 52, 20, and 22 are connected to Vdd so that they are always enabled. Writing of data into the memory cells 52, 16, 18, 20, and 22 is by conventional means well know in the industry.

Figure 3:
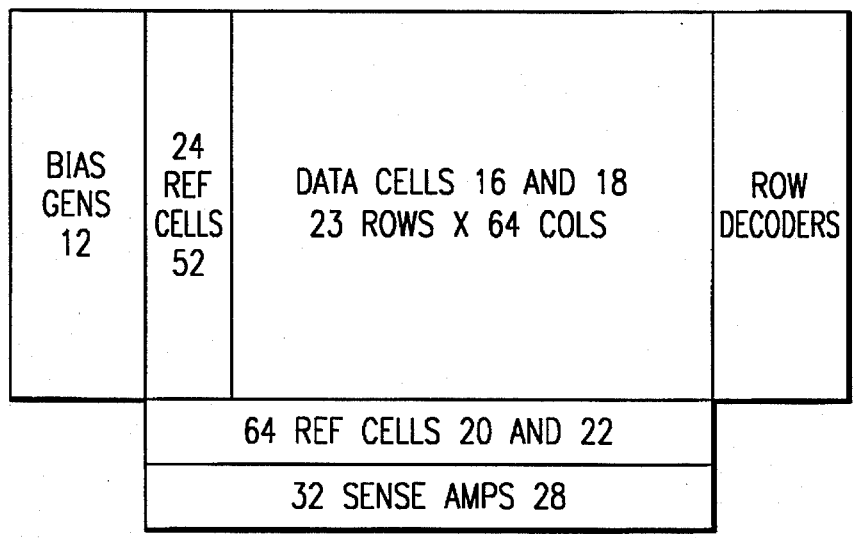
FIG. 3 is a plan view of the layout of the preferred embodiment of a non-volatile memory according to the present invention.

FIG. 3 is a plan view of the layout of the preferred embodiment of the non-volatile memory. As shown in FIG. 3 the data cell array is a matrix of 23 rows and 64 columns. Below the matrix are 64 reference cells, 32 cells 20 and 32 cells 22. Below the 64 reference cells are 32 sense amplifier current comparators 28. To the left of the matrix are 24 reference cells 52, and to the left of the reference cells are the bias generators 12. To the right of the matrix are the row decoders which provide the row read and write address signals.

Figure 4:
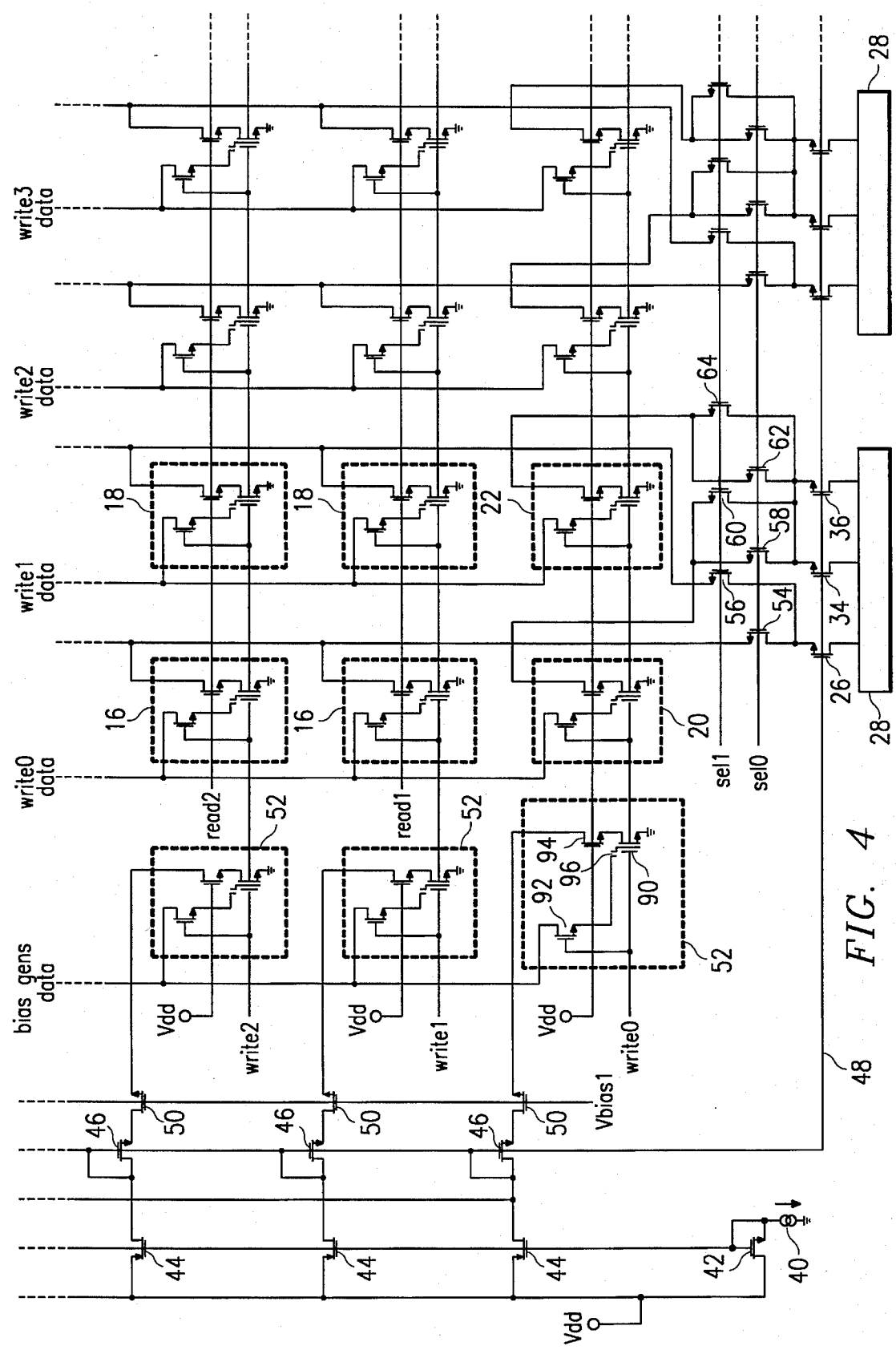
FIG. 4 is a schematic diagram of the lower left hand corner of FIG. 3.

FIG. 4 is a schematic diagram of the lower left hand corner of FIG. 3. The bias generators 12 include a single current source 40 and single current mirroring transistor 42. There are 24 copies of the reset of the bias generator 12 including 24 reference cells 52. The outputs from the 24 bias generator circuits 12 are connected together to form the node 48. The read control lines of the cells 52 are connected to Vdd.

Figure 5A:
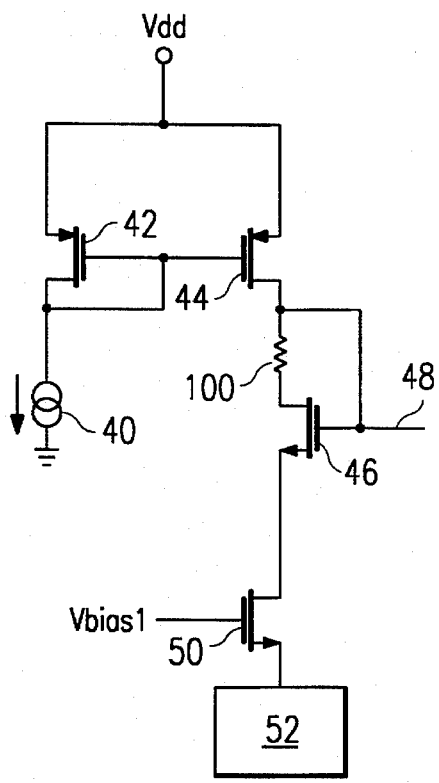
FIGS. 5A, 5B, and 5C are schematic diagrams of alternate embodiments of the bias voltage generator shown in FIG. 1.
Figure 5C:
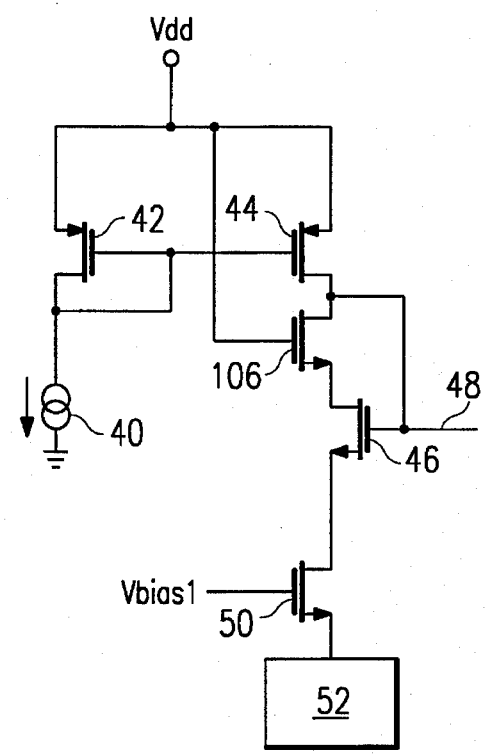
Figure 5B:
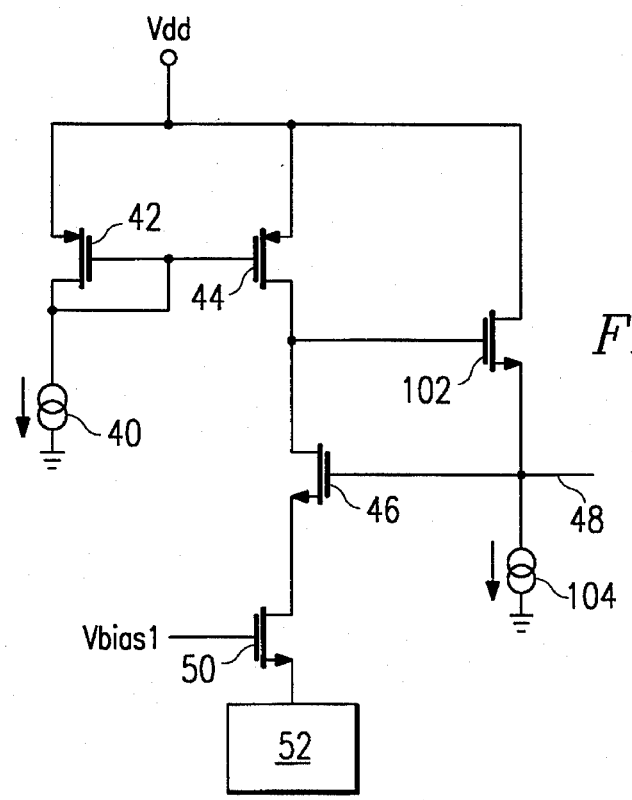

FIGS. 5A, 5B, and 5C are schematic diagrams of alternative embodiments of the bias voltage generator 12. As shown in FIG. 5A, a resistor 100 has been added between the drain of transistor 46 and the common connection of the gate of transistor 46 and the drain of transistor 44. In FIG. 5B a unity gain buffer consisting of an n-channel transistor 102 and current source 104 have been added between the drain of transistor 46 and the gate of transistor 46. In FIG. 5C a load transistor 106 has been added in place of the resistor 100 of FIG. 5A. These alternative embodiments show that the line 48 does not have to be connected directly to the drain of transistor 46.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

For example, although a sense amplifier is coupled to only two memory cells in the preferred embodiment, it will be appreciated that many more memory cells may be coupled to the sense amplifier through the appropriate selection tree as is well known in the art. As the selection tree transistors are increased then the number of transistors in transistor group 30 and 32 should be increased accordingly and the transistor 50 should be replaced by multiple transistors in order that the current path through the selection tree should be virtually the same as the current through the bias voltage generator circuit 12 and through the reference memory cell circuitry to the sense amplifier 28.

What is claimed is:

1. A non-volatile memory comprising:

a) a plurality of non-volatile semiconductor memory cells coupled through a first current limiting transistor to a sense amplifier;

b) a current reference circuit comprising a current path including a current source, a first transistor, and an additional nonvolatile semiconductor memory cell programmed to be conductive; and c) wherein the voltage on a gate of said first transistor is responsive to the current through said current path, a gate of said current limiting transistor being responsive to the voltage on said gate of said first transistor such that the maximum current through said current limiting transistor is limited by the current through said current path.

2. The non-volatile memory set forth in claim 1 wherein said plurality of non-volatile memory cells are coupled through said first current limiting transistor to a data input of said sense amplifier, said non-volatile memory further comprising:

a) a selection tree coupled between said memory cells and said first current limiting transistor b) first and second reference cells programmed in opposite logic states, each having an output coupled together and through a second current limiting transistor to a reference input of said sense amplifier; and c) a plurality of transistors coupled between said each of said first and second reference cells and said reference input of said sense amplifier and, during a memory read cycle, forming a series path of a number of conductive transistors between said first reference cell and said second current limiting transistor wherein said number of series conductive transistors corresponds to the number of transistors in said selection tree which are conductive and which form a series conductive path between one of said memory cells and said first current limiting transistor during said memory read cycle.

3. The non-volatile memory set forth in claim 1 wherein said sense amplifier has a reference input and further including first and second reference cells programmed in opposite logic states, each having an output coupled together and to said reference input.

4. The non-volatile memory set forth in claim 3 further comprising:

a) a selection tree coupled between said memory cells and said data input of said sense amplifier; and b) a plurality of transistors coupled between said each of said first and second reference cells and said reference input of said sense amplifier and forming a series of a number of transistors wherein said number of transistors corresponds to the number of transistors in said selection tree which are conductive during a memory read cycle.

5. A method for sensing data in a non-volatile memory cell comprising the steps of:

a) coupling the output of said non-volatile memory cell to the data input of a sense amplifier;

b) combining the output from a first non-volatile reference cell programmed in a first logic state with the output of a second non-volatile reference cell programmed in a second logic state to form a first reference signal;

c) dividing the current in said first reference signal into two approximately equal first and second reference current signals; and d) coupling one of said first and second reference current signals to a reference input of said sense amplifier such that said sense amplifier compares the output of said non-volatile memory cell to one of said first and second reference current signals.

\* \* \* \* \*